United States Patent [19]

Hauviller et al.

[11] Patent Number: 4,918,448

[45] Date of Patent: Apr. 17, 1990

[54] DEVICE FOR EXTENDING THE RESOLUTION OF A N-BIT RESISTIVE DIGITAL-TO-ANALOG CONVERTER TO A (N+P)-BIT DIGITAL-TO-ANALOG CONVERTER

[75] Inventors: Philippe Hauviller, Paris; Michel Verhaeghe, Vence, both of France

[73] Assignee: International Business Machines Corporation, Armonk, N.Y.

[21] Appl. No.: 249,542

[22] Filed: Sep. 26, 1988

[30] Foreign Application Priority Data

Oct. 9, 1987 [FR] France .............................. 87480013.9

[51] Int. Cl.$^4$ ............................................. H03M 1/68
[52] U.S. Cl. ........................................ 341/145; 341/136
[58] Field of Search ............... 341/144, 145, 146, 133, 341/136

[56] References Cited

U.S. PATENT DOCUMENTS

| | | | |
|---|---|---|---|
| 3,997,892 | 12/1976 | Susset | 341/145 |
| 4,491,825 | 1/1985 | Tuthill | 341/145 |
| 4,503,421 | 3/1985 | Hareyama et al. | 341/145 |
| 4,543,560 | 9/1985 | Holloway | 341/144 |

*Primary Examiner*—William M. Shoop, Jr.
*Assistant Examiner*—Marc S. Hoff
*Attorney, Agent, or Firm*—Graham S. Jones, II

[57] ABSTRACT

A device implemented in a N-bit digital-to-analog converter (DAC) to extend its resolution to N+P bits. The N-bit DAC comprises a resistive string 2 made of $2^N$ resistive elements R1 to R16. MSB switches in block 10 and LSB switches in block 12, when closed in response to combinations of the N-bits provide the voltage at one of taps N1 to N16 to node M1. The device comprises a string 18 made of $2^{P-2}$ elements connected between nodes M1 and M7, additional LSB switch block 14 and additional MSB switches SW4-2, SW8-2, SW12-2 and SW16-2 which are closed in response to combinations of the N-bits to connect the string 18 across the taps of a selected resistor R1 to R16. The voltage generated at one of the taps M1 to M7 of string 18 is provided to the (N+P)-bit DAC output 20 by means of one of the switches in block 16. The main advantages of this device are that the monotonicity of the conversion is not impaired by the extension to (N+P) bits, and that it is not space consuming when integrated in a chip. Furthermore, various conversion capabilities may be provided by controlling the switch SW21 and the switches in block 16.

9 Claims, 4 Drawing Sheets

DEVICE FOR EXTENDING THE RESOLUTION OF A N-BIT RESISTIVE DIGITAL-TO-ANALOG CONVERTER TO A (N+P)-BIT DIGITAL-TO-ANALOG CONVERTER

FIELD OF INVENTION

This invention relates to a device incorporated into a N-bit digital-to-analog converter DAC having a (N+P)-bit accuracy, to extend its resolution to a (N+P)-bit digital-to-analog converter.

BACKGROUND ART

Digital-to-analog converters (DACs) are components widely used in data processing systems. There exist various types of DACs, namely weighted current source DACs and resistive DACs. Presently, resistive N-bit DACs are built from a thin film resistor string with $2^N$ taps. One N-bit DAC stage is cascaded with another P-bit DAC stage, such as described in U.S. Pat. No. 4,543,560 through buffer amplifiers, to extend the conversion capabilities of the N-bit DAC to (N+P)-bits.

The presence of the buffer amplifiers between the two stages impairs the monotonicity of the conversion and increases the conversion time.

Furthermore, the buffer amplifies are space consuming, when the DAC converter is integrated in a chip.

SUMMARY OF THE INVENTION

An object of the present invention is to design a (N+P)-bit resistive DAC from a N-bit DAC without any accuracy degradation.

Another object of the present invention is to design such a DAC, which minimizes the conversion time added by the P-bit extension.

A further object of this invention is to design such a (N+P)-bit DAC which keeps the intrinsic monotonicity of the N-bit DAC.

Still another object is to design such (N+P)-bit DAC which minimizes the area of the DAC lay-out when integrated in a chip.

The device according to the present invention allows the resolution of a N-bit DAC having N-digital inputs (A6..A3) and one output (7) to be extended to a (N+P)-bit DAC having (N+P) digital inputs (A6..A0) set to a first or second binary value (0 or 1) and one output, for converting a (N+P)-bit word into an analog voltage generated on the output of the (N+P)-bit DAC. The N-bit DAC comprises a first string (2) made of $2^N$ resistive elements (R1 to R16), each having first and second taps, said string being mounted in series between a first terminal connected to a first voltage (V1) and a second terminal connected to a second voltage (V2), and a first set of at least $2^N$ switches (10, 12). Each switch is mounted between the first tap of a resistive element and the N-bit DAC output and is responsive to a combination of the values of the N digital inputs to establish a first conductive path between the first tap of a selected one of said resistive elements and the output of the N-bit DAC.

The device comprises:

a second string (18) comprising at least $2^P-2$ elements (Z1 to Z6) and being connected in series between a first node (M1) connected to the N-bit DAC output, and a second node (M7), said elements having first and second pads, a second set of switches (10,14:60), each switch being mounted between the second tap of a resistive element and the second node (M7), and being responsive to the same combinations of the N digital inputs as the first set of switches to establish a second conductive path between said second node (M7) and the second tap of the selected one of said resistive elements (R1 to R16), means (22, SW21) responsive to a specific combination of the P-bits to disconnect the second resistive string from the first and second nodes (M1, M7) and provide the voltage generated at the N-bit DAC output to the output of the (N+P)-bit DAC when said P-bits are set to the first value.

The switches in the second set, when closed present the same impedance as the switches in the first set, whereby the first and second conductive paths present the same impedance (Z).

The second string comprises $2^P-2$ elements made of switches which, when closed, present the same impedance as the switches in the first and second sets which comprise the first and second conductive paths, whereby said first and second paths are part of said second string.

In a preferred embodiment of the present invention, the first set of switches comprises:

$2^N$ Most Significant Bits (MSB) switches which are partitioned into $2^m$ groups of $2|$ switches, where N is equal to $m+|$ and me is the number of MSB's (A6, A5) of the digital inputs and is the number of least significant bits (A4, A3), of the digital inputs, with $1<|<n$ the $2|$ switches of each group being responsive to one of the $2^m$ combinations of the m bits, each MSB switch having a first terminal connected to a first tap (N1 to N16) of the first resistive string, and a second terminal, the second terminals of the first, second, ..$2|$ th switches of each group being connected to $2|$ common points (OUT1 ... OUT4)

$2|$ first LSB switches (12) each one being responsive to one of the $2|$ combinations of the | bits, and having a first terminal connected to one of the $2|$ common points and a second terminal connected to the first node (M1), and the second set of switches comprises:

an additional switch in each group responsive to the same logical combinations of the m bits as the MSB switches comprising the group, and having a first terminal connected to the second tap of every $2|$ th resistive element and a second terminal connected to a $(2|+1)$ th common point, $2|$ second LSB switches, each one being responsive to the same combinations of the | bits as the $2|$ first LSB switches and having a first terminal connected to one of the second to $2|$ th common points and a second terminal connected to the second node (M7), whereby for any combination of the N-bits, the first conductive path comprises a selected one of the $2^N$ MSB switches in series with a selected one of the first LSB switches and the second conductive path comprises a selected one of the $2^N$ MSB switches or one of the additional MSB switches in series with a selected one of the second LSB switches.

DETAILED DESCRIPTION OF THE PREFERRED EMBODIMENT OF THE INVENTION

Figure 1:
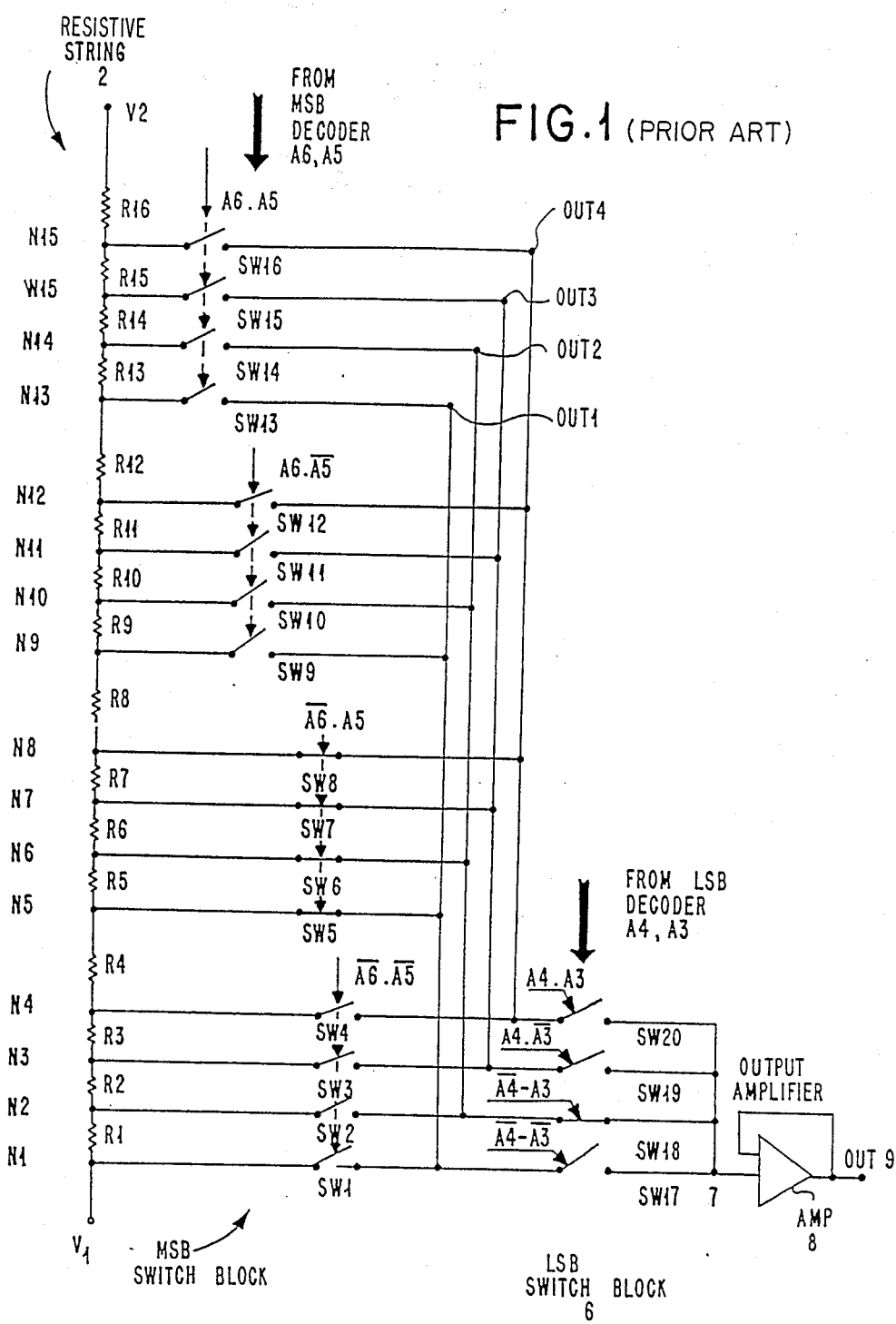
FIG. 1 shows a conventional 4-bit Digital-to-Analog Converter (DAC).
Figure 2:
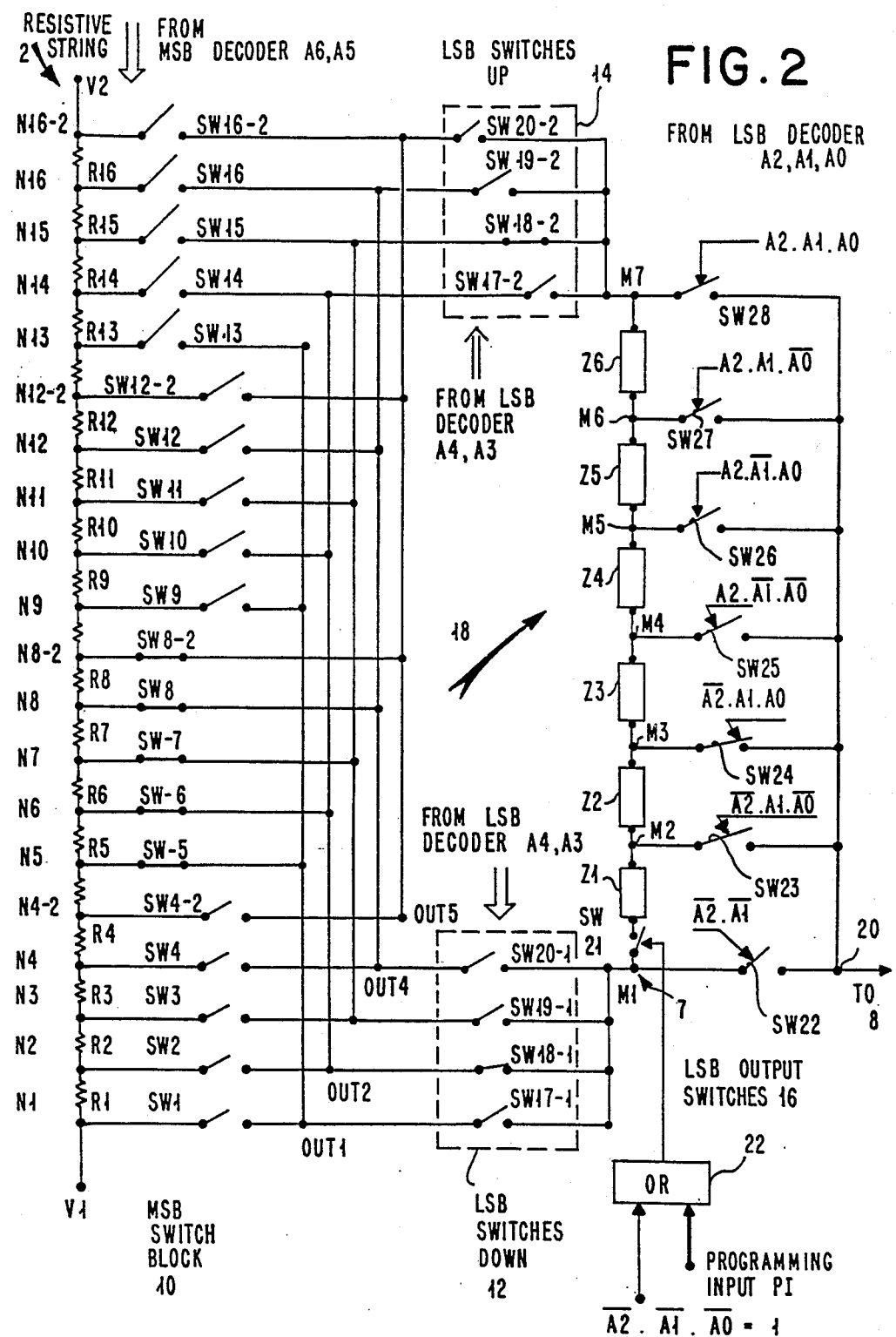
FIG. 2 shows the DAC of FIG. 1 modified to implement the present invention, to extend the conversion capability from 4-bits to 7 bits.

FIG. 1 shows the resistor and switch arrangement of a conventional N-bit digital-to-analog converter (DAC). For the sake of clarity, N has been chosen equal to 4. FIG. 2 shows how this arrangement, may be extended to built a 4+P DAC, when P is equal to 3.

The 4-bit input word which is provided to the arrangement of FIG. 1, comprises four bits A6, A5, A4, A3.

The DAC arrangement of FIG. 1, comprises $2^N = 2^4 = 16$ resistors, R1 to R16 having a unit resistance R, serially mounted between two voltage sources V1 and V2. They comprise a resistor string 2 provided with sixteen taps N1 to N16. Switches SW1 to SW16 are connected to the taps N1 to N16. These switches comprise the Most Significant Bits (MSB) switch block 4. The switches are arranged into four groups comprising four switches.

The first group comprises switches SW1 to SW4, second group comprises switches SW5 to SW8, third group comprised switches SW9 to SW12 and fourth group comprises switches SW13 to SW16. The first terminal of each switch is connected to a corresponding tap of the resistor string. As shown in FIG. 1, the second terminals of first, second, third and fourth switches in the four groups are connected in common to output nodes OUT1, OUT2, OUT3 and OUT4 respectively.

Output nodes OUT1 to OUT4 are connected to LSB switch block 6, comprising switches SW17, SW18, SW19 and SW20. The first terminals of switches SW17 to SW20 are connected to nodes OUT1 to OUT4 respectively.

The second terminals of switches SW17 to SW 20 are connected in common at node 7. Node 7 is connected to the input of output amplifier AMP 8. The analog voltage is generated at the output 9 of amplifier 8.

The closed or open status of the switches of the first switching arrangement depends upon the value of the (MSBs): A6 and A5 and the status of switches in the second switching arrangement depends upon the value of the least significant bits (LSB): A4 and A3.

It is assumed that switches SW1 to SW4 in the first group are closed when A6 and A5 are 00, switches SW5 to SW8 in the second group are closed when A6 and A5 are 01, switches SW9 to SW12 in the third group are closed when A6 and A5 are 10, and SW13 to SW16 are closed when A6 and A5 are 11.

SW17 is closed when A4 and A3 are 00. SW18 is closed when A4 and A3 are 01. SW19 is closed when A4 and A3 are 10. SW20 is closed when A4 and A3 are 11.

The logical conditions which cause the switches to be closed are indicated in FIG. 1.

Thus, the switches are controlled by the output of MSB and LSB decoders which are not shown in FIG. 1.

FIG. 1 shows the status of the switches in case A6, A5, A4 and A3 are 0101 respectively, so that the voltage V6 at node N6 is provided at the analog output OUT.

Assuming N is equal to any integer number n, the converter will include $x = 2^n$ resistors R1 to Rx and $x = 2^n$ taps N1 to Nx.

n is equal to any number m of most significant bits and $|$ least significant bits such as $n = m + |$ with $1 \leq | < n$.

There will be $2^m$ groups of $2|$ switches in block 10 and $2|$ switches in block 6.

The switches in each $2^m$ groups will be controlled by one of the $2^m$ combinations of m MSB bits and the switches in block 6 will be controlled by the 2 combinations of the $|$ bits.

When $| = 0$, block 6 is not needed and block 10 comprises $2^n$ switches.

According to the present invention, a 4-bit resistive DAC as shown in FIG. 1, may be extended to a (4+P)-bit DAC, by providing an additional string, comprising $2^P$ elements provided with taps and arranged to divide the voltage difference across a selected one of the resistors R1 to 16 by $2^P$. FIG. 2 shows the implementation of this concept when P is equal to 3.

As shown in FIG. 2, the device comprises the resistive string 2, MSB switch block 10, three LSB switch blocks 12, 14 and 16 and string 18.

Resistive string 2 comprises additional taps, namely taps N4−2, N8−2, N12−2, duplicating taps N5, N9, 13 and tap N16−2 located at the upper terminal of resistor R16 connected to voltage V2. Additional switches SW4−2, SW8−2, SW12−2 and SW16−2, which are part of the first, second, third and fourth groups of switches are connected to these additional taps, on one side and to an additional common point OUT5 on the other side. They are controlled by the same logical conditions as the switches in the first, second, third and fourth groups, respectively.

Nodes OUT1, OUT2, OUT3 and OUT4 are connected to the switches in the LSB SWITCH DOWN block 12 which comprises switches SW17−1, SW18−1, SW19−1, SW20−1 which are arranged and controlled as the corresponding switches in block 6 of FIG. 1.

Nodes OUT2, OUT3, OUT4 and OUT5 are connected to LSB SWITCH UP block 14 which comprises switches SW17−2, SW18−2, SW19−2 and SW20−2, which are arranged as corresponding switches SW17−1 to SW20−1 in block 12 with respect to nodes OUT2 to OUT5 and controlled by the same logical conditions.

The common points M1 and M7 of switches SW17−1 to SW20−1 and SW17−2 to SW20−2 are connected to the ends of string 18. This string contains $2^P − 2$ resistive elements Z1 to Z6 for the reasons which will be explained later.

Taps M2, M3, M4, M5 and M6 are provided at the common points of two consecutive elements of the string.

LSB output switch block 16 comprising switches SW22, SW23, SW24, SW25, SW26, SW27 and SW28 is controlled by the P additional bits A2, A1 and A0. The first terminals of these switches SW22 to SW28 are connected to taps M1 to M7 respectively and the second terminals are connected to common node 20. Node 20 is connected to the input of output amplifier 8 in the same way as node 7 of FIG. 1. The logical conditions which cause these switches to be closed are indicated in FIG. 2.

A string disconnection means, which is schematically represented in FIG. 2 by switch SW21, is provided to disconnect the string 18 from the taps M1 and M7, when the LSB's A2, A1 and A0 are 000, or when the converter is used as N-bit DAC. This is performed by means of OR circuit 22, the inputs of which are active, when the three bits A2, A1 and A0 are at 0 or when a programming input PI is at 1. This is schematically presented in FIG. 2.

In the preferred embodiment of the present invention, the MSB switches in block 10 have the same impedance and the LSB switches in block 12 and 14 also have the same impedance. One MSB switch associated to one LSB switch present a finite series resistance Z in the range of 10 kiloohms which is high with respect to the unit resistor value R, which is in the range of 5 ohms. The impedance of the elements Z1 to Z6 is referenced by Z.

Assuming that the digital inputs bits are A6 A5 A4 A3 A2 A1 A0=0101000, switches SW−5 to SW8 and SW8−2 in the second group of switches in block 10 are closed, the other switches in this block are open, as shown in FIG. 2. Switches SW18-1 and SW18-2 in blocks 12 and 14 are closed. Switch SW 22 is closed and since switch SW21 is open the voltage at node N6 is provided to output node 20.

Assuming that the three additional P bits are different from 000, the string 18 is connected between M1 and M7. Thus, node N6 is connected to node N7 through a bridge comprising, one resistive element, the impedance of which is equivalent to the resistance of closed switches SW6 and SW18-1, i.e. Z, the six elements of string 18 and one element the impedance is which is equivalent to the resistance of closed switches SW7 and SW18-2, i.e. Z. This means that a fraction of the voltage V across resistor R7, which is equal to $(V2-V1)/2^N$, i.e. $(V2-V1)/16$, is provided at taps M1 to M7. Thus, the voltages at taps M1 to M7 are the following, assuming Vx is the voltage at a tap Nx selected by the N-most significant bits of the (N+P)-bit word, i.e. top N6 as shown in FIG. 2.

M1→Vx=v/8
M2→Vx+2v/8
M3→Vx+3v/8
M4→Vx+4v/8
M5→Vx+5v/8
M6→Vx+6v/8
M7→Vx+7v/8

One of these voltages is provided to node 20, by means of one among switches SW22 to SW28 in block 16, which is closed depending upon the values of the P bits, as shown in FIG. 2. For example, if the P bits were 001, switch SW22 would be closed. If they were 111, switch SW28 would be closed.

Switch SW22 is also closed, when the P bits are 000, in which case, switch SW21 is open.

Two taps, N4-2, N8-2, N12-2 are provided at nodes N5, N9, N13 and an additional tap N16-2 is provided at the uppermost terminal of resistor R16 to allow the string 18 to be connected across resistors R4, R8, R12 and R16.

Figure 3:
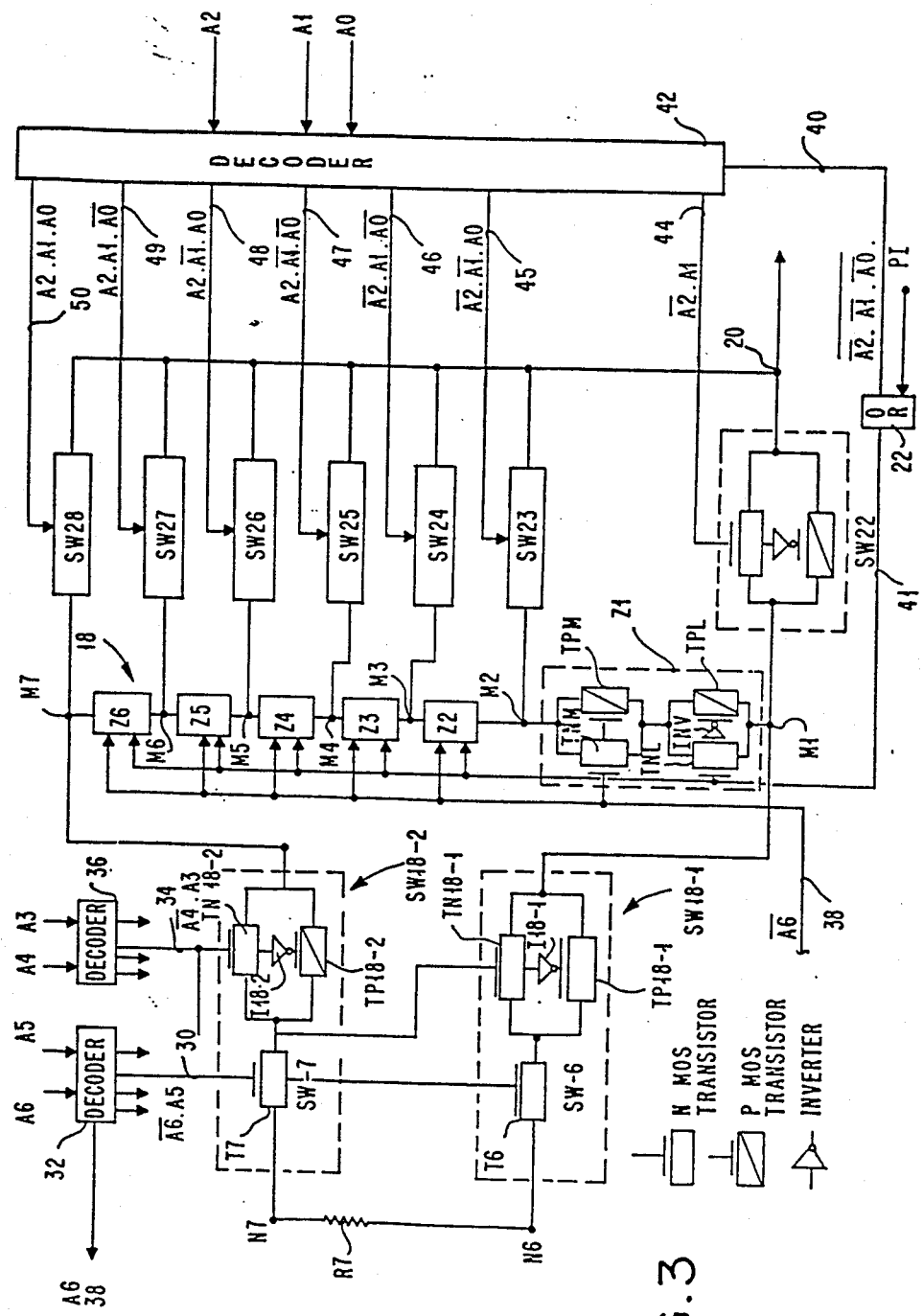
FIG. 3 shows the detailed implementation of the switching arrangements in blocks 10, 12, 14 and 16 and resistive elements Z1 to Z6 of FIG. 2.
Figure 4:
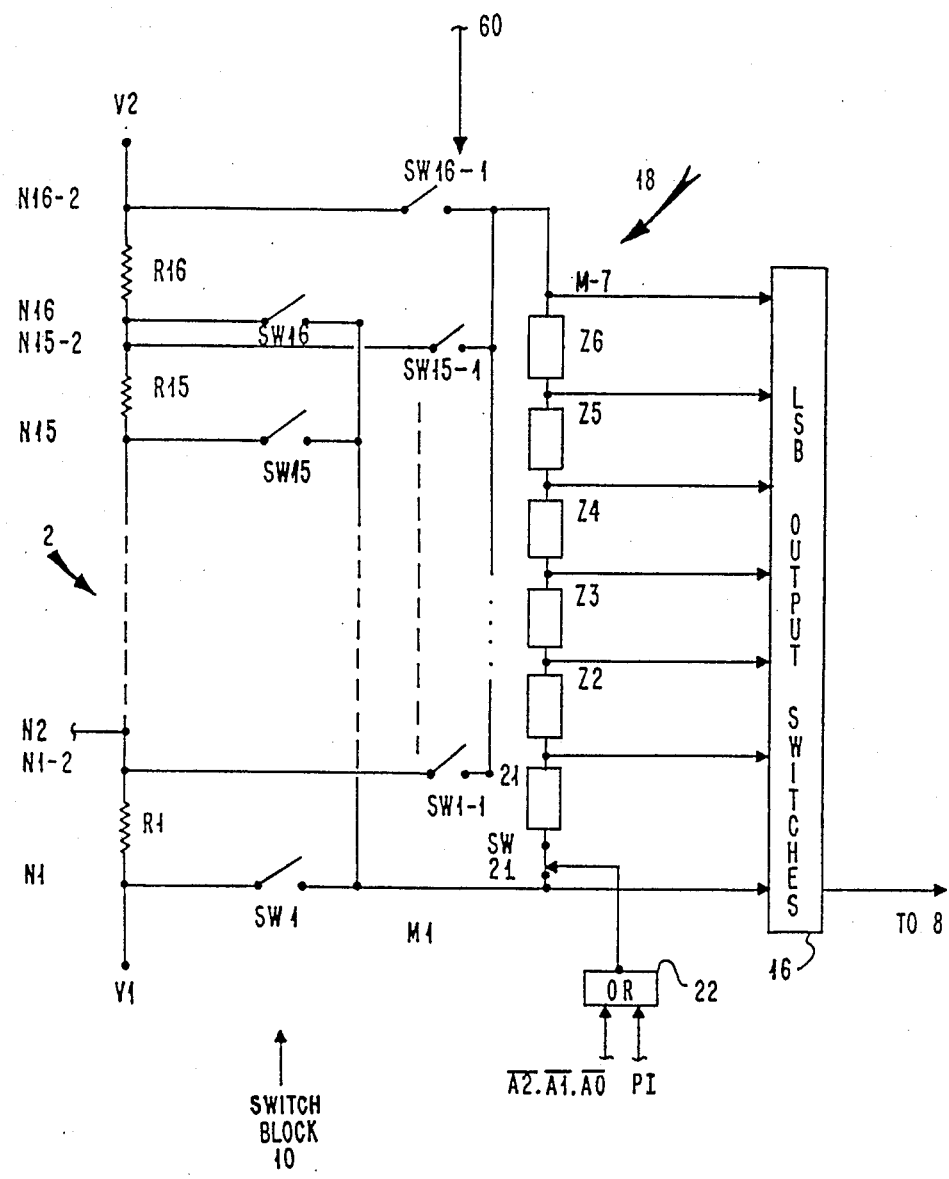
FIG. 4 shows how the device according to the present invention is implemented when the N-bit DAC does not comprise LSB block 12.

FIG. 3 represents a detailed implementation of the switches and elements Z1 to Z6.

In a preferred embodiment of the present invention, switches SW1 to SW8, SW4-2 and SW8-2 which are closed when A6=0 are NMOS transistors. Switches SW9 to SW16 and SW12-2 and SW16-2 which are closed when A6=1 are PMOS transistors.

Only, the arrangement provided between nodes N6 and N7 is shown in FIG. 3.

The gates of transistor T7 and T6 of switches SW7 and SW6 are connected to the output line 30 of bit decoder 32, which is active when the condition A6·.A5=1 is met.

Switches SW18-1 and SW18-2 have the same structure. Switch SW18-1 comprises NMOS transistor TN18-1 and PMOS transistor TP18-1 and switch SW18-2 comprises NMOS transistor TN18-2 and PMOS transistor TP18-2. These complementary transistors are mounted in parallel and are serially mounted with MSB switch transistor T6, T7, as shown in FIG. 3.

NMOS And PMOS transistors comprising switch SW18 are made ON when the logical condition A4.A3 is met.

Thus, the corresponding output line 34 of bit decoder 36 is provided to the gates of transistors TN18-2 and TN18-1. This line is also provided to inverters I18-1 and I18-2, the outputs of which are provided to the gates of PMOS transistors TP18-1 and TP18-2.

Elements Z1 to Z6 comprise NMOS transistor TNM and PMOS transistor TPM which are mounted in parallel and the gate of which are connected to output line 38 of decoder 30 activated when A6 is equal to 0. Thus when A6 is equal to 0, TNM transistors of resistive elements Z1 to Z6 are ON to copy the impedance of the NMOS making up switches SW1 to SW8, SW4-2 and SW8-2. When A6 is equal to 1, TPM transistors of resistive elements Z1 to Z6 are ON to copy the impedance of the PMOS transistors making up switches SW9 to SW16, SW12-2 and SW16-2.

Transistors TNM and TPM in elements Z1 to Z6 must track NMOS and PMOS transistors making up block 10.

Elements Z1 to Z6 also comprise NMOS transistor TNL and PMOS transistor TPL which are mounted be parallel and arranged in series with transistors TNM and TPM. Transistors TNL and TPL are arranged as transistors TN18 and TP18 making up switches SW18-1 and SW18-2.

The gates of transistors TNL in elements Z1 to Z6 are connected to output line 40 of decoder 42 through OR gate 22. Line 40 is at zero level when A2, A1 and A0 are at 0, to cause transistors TNL of elements Z1 to Z6 to be off, to disconnect the string 18 from nodes M1 and M7.

Output line 41 of OR circuit 22 is provided to inverters INV in elements Z1 to Z6, the output lines of which are provided to the gates of transistors TPL to cause these transistors to be OFF when line 40 is at 0 level.

NMOS transistors TNL must track NMOS transistors of LSB switch UP and DOWN blocks 12 and 14. PMOS transistors TPL must track PMOS transistors of blocks 12 and 14.

Output switches SW22 to SW28 have the same structures as switches SW 18-1 and 18-2, their gates are controlled by the output signals on lines 44 to 50 of decoder 42 which are active when the logical conditions indicated in FIGS. 2 and 3 are met.

This device may be used as a N-bit DAC with N=4, with a 7 bit accuracy, when the programming input PI provided to one input of OR gate 22 is set to disconnect the string 18 from nodes M1 and M7.

When the programming input PI is set to allow the connection the string 18 between nodes M1 and M7, the resolution of N-bit DAC may be extended by P, with P=3 as shown in FIG. 2.

The resolution may be extended by 2, dividing the voltage across a selected resistor in string 2 by $2^2=4$. This may be done by connecting node M1, node M2, node M4 or node M6 to output 20, through the output switches SW22, SW23, SW25, SW27 controlled by the following values of LSB bits 00, 01, 10, 11.

The resolution may be extended by 1, by dividing the voltage across a selected resistor in string 2 by 2. This may be done by connecting nodes M1 and M4 to output 20, through output switches SW22 and SW25 controlled by the value 0 or 1 of the additional bit.

This also may be done by providing switches which short together selected nodes M1 to M7 or M2 to M6 when closed, and taking the analog levels through switches SW22, SW27 or SW28, as the case may be. The concept described in reference to FIGS. 2 and 3 may be extended to any value of N and P. Assuming N=n-m+|, n being equal to any integer number, as described before, with $1 \leq | < n$.

The resistor string 2 comprises $x = 2^n$ resistors R1 to Tx, $x=2^n$ MSB switches in block 10. 2| switches in LSB SWITCH UP and DOWN blocks 12 and 14. String 18 comprises $2^P$-2 elements where P is the maximum number of extension bits. Block 16 comprises $2^P$-1 output switches.

If |=0, the function performed by block 14, will be performed through a switching arrangement 60 comprising $2^n$ switches SW1-1 to SW6-1 having the same impedance, when closed, as switches SW1 to SW16 in block 10 and controlled by the same logical conditions as switches SW1 to SW16. Switches SW1-1 to SW16-1 have first terminals connected in common to node M7 and second terminals connected to taps N1-2 to N15-2 duplicating taps N2, to N16 of the resistor string 2 and the tap N16-2, respectively. In that case, when switches in block 10 are made with NMOS and PMOS transistors, the resistive elements Z1 to Z6 only comprise NMOS and PMOS transistors TNM and TPM copying the NMOS or PMOS transistors in block 10.

In any case, assuming N equal to 8, and P equal 4, it may be possible to build a 12-bit resolution DAC with 12 bit accuracy, a 8-bit resolution DAC with 12 bit accuracy, either by keeping the four LSB bits at a low level or by setting the programming input, or a 10-bit resolution DAC with a 12 bit accuracy by controlling selected ones of the output switches.

What is claimed is:

1. Device for extending the resolution of a N-bit digital-to-analog DAC converter having N-digital inputs (A6..A3) and one output (7) to a (N+P)-bit DAC having (N+P) digital inputs (A6..A0) set to a first or second binary value (0 or 1) and one output, for converting a (N+P)-bit word into an analog voltage generated on the (N+P)-bit DAC, said N-bit DAC comprising a first string (2) made of $2^N$ resistive elements (R1 to R16), each having a first and a second taps, said string being mounted in series between a first terminal connected to a first voltage (V1) and a second terminal connected to a second voltage (V2), and a first set of at least $2^N$ switches (10,12), each switch being mounted between the first tap of a resistive element and the N-bit DAC output and being responsive to one of the $2^N$ combinations of the values of the N digital inputs to establish a first conductive path between the first tap of a selected one of said resistive elements and the output of the N-bit DAC, said device being characterized in that it comprises:

a second string (18) comprising at least $2^P$-2 elements and being connected in series between a first node (M1) connected to the N-bit DAC output, and a second node (M7), said elements having first and second pads, a second set of switches (14), each switch being mounted between the second tap of a resistive element of the first string and said second node and being responsive to the same combinations of the values of the N digital inputs as the first set of switches to establish a second conductive path between said second node (M7) and the second tap of the selected one of said resistive elements (R1 to R16), means (22, SW21) responsive to a specific combination of the P-bits to disconnect the second string from the first and second nodes (M1, M7) and provide the voltage generated at the N-bit DAC output to the output of the (N+P)-bit DAC when all said P-bits are set to the first value.

2. A device in accordance with claim 1, wherein said switches in the second set, when closed present the same impedance as the switches in the first set, whereby the first and second conductive paths present the same impedance (Z).

3. Device according to claim 2, characterized in that the second string comprises $2^P$-2 elements made of switches, each presenting when closed the same impedance as the switches in the first and second sets which comprise the first and second conductive paths.

4. Device according to claim 3, characterized in that:
   the first set of switches comprises:
   $2^N$ MSB switches which are partitioned into $2^m$ groups of 2| switches, where N is equal to m+| and m is the number of most significant MSB bits (A6, A5) of the digital inputs and | is the number of least significant bits (A4, A3) of the digital inputs, with $1 < | < n$, the 2| switches of each group being responsive to one of the $2^m$ combinations of the m bits, each of said MSB switches having a first terminal connected to a first tap (N1 to N16) of the first resistive string, and a second terminal, the second terminal of the first, second, ..2| th switches of each group being connected to 2| common points (OUT1..OUT4),
   2| first LSB switches (12) each one being responsive to one of the 2| combinations of the | bits, and having a first terminal connected to one of the 2| common points and a second terminal connected to the first node (M1),
   the second set of switches comprises:
   an additional switch in each group responsive to the same logical combinations of the m bits as the MSB switches comprising the groups, and having a first terminal connected to the second tap of every 2| the resistive element and a second terminal connected to a (2| +1)th common point,
   2| second LSB switches, each one being responsive to the same combinations of the | bits as the 2| first LSB switches and having a first terminal connected to one of the second to 2| th common points and a second terminal connected to the second node (M7), whereby for any combination of the N-bits, the first conductive path comprises a selected one of the $2^N$ MSB switches in series with a selected one of the first LSB switches and the second conductive path comprises a selected one of the $2^N$ MSB switches or one of the additional MSB switches in series with a selected one of the second LSB switches.

5. Device according to claim 4, characterized in that the $2^N$ MSB switches and additional MSB switches are MOS transistors, the gates of which are responsive to a combination of the m most significant bits.

6. Device according to claim 5, characterized in that the MSB switches and additional switches and additional switches in the $2^{(m-1)}$ first groups which are made conductive when the most significant bit among the m bits is at the first value (0) are NMOS transistors and the MSB switches and additional switches in the $2^{(m-1)}$ following groups which are made conductive when the most significant bit among the m bits is at the second value (1) are PMOS transistors.

7. Device according to claim 6 characterized in that the first and second LSB switches comprises: a first NMOS transistor (TN18-1) the gate of which is responsive to a combination of the P bits and a first PMOS transistor (TP18-1) which is parallely mounted with the first NMOS transistor and the gate of which is responsive to the inverted combination of the | bits.

8. Device according to claim 7 characterized in that the second elements (Z1 to Z6) comprises:
- a first NMOS transistor (TNM) parallely mounted with a first PMOS transistor (TPM), both transistors having their gates responsive to the most significant bit among the m bits,
- a second NMOS transistor (TNL) and a second PMOS transistor (TPL) parallely mounted and being both conductive except when the P additional bits are at the first value, to thereby disconnect the second string from first and second nodes.

9. Device according to any one of claims 1 to 8, characterized in that it comprises means (PI,22) for disconnecting the string in response to a control input signal (PI), whereby the (N+P)-bit DAC may be used as a N-bit DAC with a (N+P-bit accuracy.

* * * * *